(12) United States Patent
Batruni

(10) Patent No.: US 7,199,736 B2
(45) Date of Patent: Apr. 3, 2007

(54) DIGITAL LINEARIZING SYSTEM

(75) Inventor: Roy G. Batruni, Danville, CA (US)

(73) Assignee: Optichron, Inc., Fremont, CA (US)

( * ) Notice: Subject to any disclaimer, the term of this patent is extended or adjusted under 35 U.S.C. 154(b) by 36 days.

(21) Appl. No.: 11/091,014

(22) Filed: Mar. 24, 2005

(65) Prior Publication Data

US 2005/0219089 A1    Oct. 6, 2005

Related U.S. Application Data

(60) Provisional application No. 60/556,550, filed on Mar. 25, 2004.

(51) Int. Cl.
    *H03M 1/06*    (2006.01)
(52) U.S. Cl. .................. 341/118; 341/120; 330/136; 330/149
(58) Field of Classification Search ........ 341/118–120, 341/144, 155; 330/136, 149
    See application file for complete search history.

(56) References Cited

U.S. PATENT DOCUMENTS

| | | | |
|---|---|---|---|
| 4,435,823 A | | 3/1984 | Davis et al. |
| 4,843,583 A | | 6/1989 | White et al. |
| 5,182,558 A | | 1/1993 | Mayo |
| 5,302,909 A | | 4/1994 | Kettenis et al. |
| 5,532,642 A | * | 7/1996 | Takai .................. 330/151 |
| 5,535,246 A | | 7/1996 | Beech |
| 5,685,317 A | | 11/1997 | Sjostrom |
| 5,786,728 A | * | 7/1998 | Alinikula .................. 330/149 |
| 6,181,754 B1 | | 1/2001 | Chen |
| 6,351,227 B1 | | 2/2002 | Rudberg |
| 6,351,740 B1 | | 2/2002 | Rabinowitz |
| 6,388,518 B1 | * | 5/2002 | Miyatani .................. 330/149 |
| 6,424,275 B1 | * | 7/2002 | Velazquez .................. 341/118 |
| 6,512,417 B2 | * | 1/2003 | Booth et al. .............. 330/149 |
| 6,538,592 B1 | | 3/2003 | Yang et al. |
| 6,570,514 B1 | * | 5/2003 | Velazquez .................. 341/118 |
| 6,621,340 B1 | * | 9/2003 | Perthold et al. ........... 330/149 |
| 6,677,820 B2 | * | 1/2004 | Miyatani .................. 330/149 |
| 6,677,821 B2 | * | 1/2004 | Kusunoki et al. ........... 330/149 |
| 6,856,191 B2 | | 2/2005 | Bartuni |
| 6,885,323 B2 | | 4/2005 | Batruni |

OTHER PUBLICATIONS

U.S. Appl. No. 60/556,663, filed Mar. 25, 2004, Roy G. Batruni.

(Continued)

*Primary Examiner*—Lam T. Mai
(74) *Attorney, Agent, or Firm*—Van Pelt, Yi & James LLP

(57) ABSTRACT

A method of compensating for nonlinear distortions in a digital signal comprises receiving the digital signal, generating a nominal phase shifted signal based on the digital signal, generating a modeled distortion signal based on the digital signal and the nominal phase shifted signal, subtracting the modeled distortion signal from the digital signal, and generating a compensated signal.

A compensating system comprises an input interface configured to receive a digital signal having nonlinear distortion, and a distortion model coupled to the interface, configured to generate a nominal phase shifted signal based on the digital signal, generate a modeled distortion signal based on the digital signal and the nominal phase shifted signal, subtract the modeled distortion signal from the digital signal, and generate a compensated signal.

32 Claims, 9 Drawing Sheets

OTHER PUBLICATIONS

U.S. Appl. No. 11/061,850, Batruni.

Frank, Walter A., "An Efficient Approximation to the Quadratic Volterra Filter and Its Application I Realtime Loudspeaker Linearization", Universitat der Bundeswehr Munchen, D85577 Neubiberg Germany, no month, no year.

Frank, Walter A., "On the Equalization of Nonlinear Systems", Universitat der Bundeswehr Munchen, Neubiberg, Germany, no month, no year.

Giannakis, Georgios B., "Blind Franctionally Spaced Equalization of Noisy FIR Channels: Direct and Adaptive Solutions", IEEE Transactions on Signal Processing, vol. 45, No. 9, Sep. 1997.

Griffith, David W., Jr. et al, "Partially Decoupled Volterra Filters: Formulation and LMS Adaptation" Dept. of Electrical Engineering, University of Delaware, Newark, Delaware. no month, no year.

Schulz-Mirbach, Hanns, "Nonlinear Model-Based Analysis and Description of Images for Multimedia Applications", Internal Report Jul. 1996, TU Hamburg-Harburg, Technische Informatik I, Oct. 1996.

* cited by examiner

DIGITAL LINEARIZING SYSTEM

CROSS REFERENCE TO OTHER APPLICATIONS

This application claims priority to U.S. Provisional Patent Application No. 60/556,550 entitled DIGITAL LINEARIZING SYSTEM filed Mar. 25, 2004, which is incorporated herein by reference for all purposes.

BACKGROUND OF THE INVENTION

In signal processing systems, there is often a need to compensate for nonlinear distortions introduced by the system. There are many possible sources for system nonlinearities, including characteristics of nonlinear components such as inductors, capacitors and transistors. Nonlinearities are frequently introduced when analog signals are converted to digital. Besides component nonlinearities, analog-to-digital converters (ADCs) often have additional sources of nonlinearity, such as the sampling capacitors' time constants, gain error in amplifiers and imprecision in the comparator levels.

Nonlinear distortions may depend on many factors such as the input signal's frequency range, history and rate of change (also referred to "slew rate"), as well as external factors such as operating temperature. The difficulties in modeling nonlinear distortions lead to difficulties in characterizing and compensating system nonlinearities. Existing techniques for characterizing system nonlinearities such as Volterra expansion tend to be complex and difficult to implement.

Furthermore, in some systems, even if a distortion model is found by using Volterra expansion, it could not be accurately applied due to the unavailability of the required inputs. For example, in some communication systems, the receiver circuitry may introduce nonlinearities when the input analog signal is digitized and demodulated to baseband. The intermediate frequency (IF) signal required by the distortion model is often unavailable since the IF signal is directly demodulated to baseband when the ADC samples the signal. Applying the baseband signal to the distortion model usually means that some of the history and slew rate information is lost; therefore, the distortion estimation is less accurate.

It would be useful to have a way to better compensate for system nonlinearities even as some of the data required by the distortion model is not available as input. It would also be useful if the compensation scheme could be applied without requiring special data access.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A method and system for compensating nonlinear distortion in a digital signal is disclosed. In some embodiments, a nominal phase shifted signal is generated based on the digital signal. A modeled distortion signal is generated based on the digital signal and the nominal phase shifted signal and then subtracted from the digital signal. A compensated signal is then generated. A digital signal may result from an analog input restricted to a known region of operation (such as a Nyquist zone). In some embodiments, the nominal phase shifted signal is generated by interpolating the digital signal and taking interpolated values at fractional intervals of the sampling period of the digital signal. In some embodiments, the nominal phase shifted signal is generated by up-sampling the digital signal, filtering the up-sampled signal and obtaining interpolated values at fractional intervals of the sampling period. A derivative calculated based on the digital signal and/or the nominal phase shifted signal may also be used by the distortion model. A compensating system comprising a distortion model may be configured to correct for nonlinear distortions in analog to digital converters, receiver circuits, or any other appropriate system with nonlinear distortion in its channel.

Figure 1A:
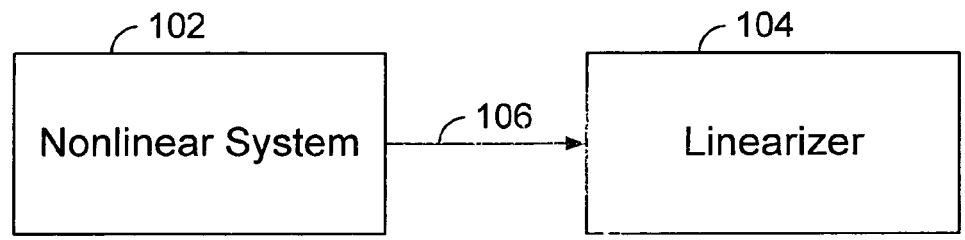
FIGS. 1A–1C are diagrams illustrating several linearizer embodiments.
Figure 1B:
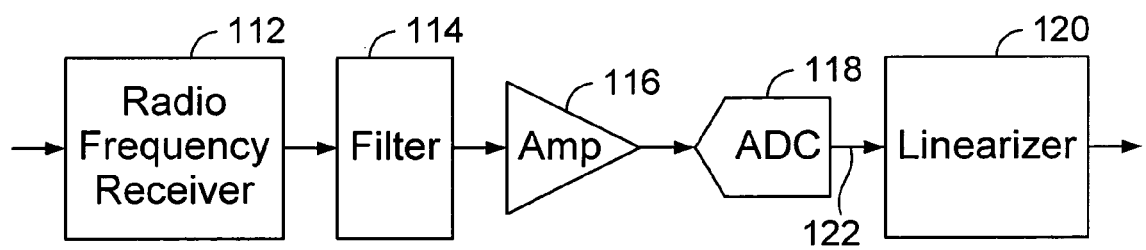
Figure 1C:
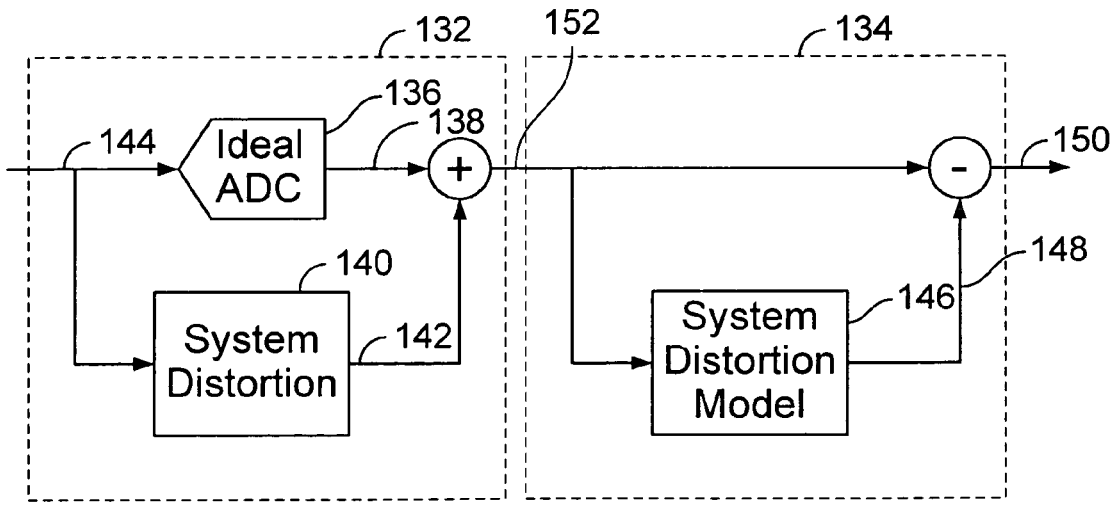

FIGS. 1A–1C are diagrams illustrating several linearizer embodiments. In FIG. 1A, the output of nonlinear system 102 is sent to linearizer 104, which is configured to compensate for output distortion. The linearizer can be implemented as software or firmware code embedded in a processor, a field programmable date array (FPGA), a programmable digital signal processing (DSP) engine, an application specific integrated circuit (ASIC), any other appropriate device or combinations thereof. In this example, output 106 is treated as an ideal undistorted component plus a distortion component. The distortion component is separate from ADC quantization error, which is equal to the portion of the analog signal below the finest ADC quantization level and typically cannot be reduced for an ADC with a predefined number of bits. The distortion component is to be predicted and corrected by linearizer 104. As will be shown in more details below, linearizer 104 is configured to model the distortion component using output 106 of the nonlinear system.

FIG. 1B is a block diagram of a receiver circuit embodiment that includes a linearizer. In this example, an analog radio frequency (RF) signal is received by radio frequency receiver 112. The signal is demodulated to an IF signal by filter 114, and the IF signal is then amplified by amplifier 116. The signal is converted to digital by ADC 118. Linearizer 120 is configured to compensate for nonlinear distortion in digital signal 122 that results from component nonlinearities in receiver chain. Similar to signal 106 of FIG. 1A, signal 122 is treated as if it includes an ideal ADC output component and a distortion component. The linearizer estimates the distortion based on digital signal 122 and generates a compensated output.

In FIG. 1B, linearizer 120 is trained to model the nonlinear distortion introduced by the entire receiver chain. A similar linearizer may also be used to compensate for nonlinearities in individual components. For example, in FIG. 1C, linearizer 134 is coupled to ADC 132 and is configured to compensate for the nonlinear distortions in the ADC. For purposes of illustration, ADC 132 is treated as the equivalent of an ideal analog-to-digital converter 136 that generates an ideal digital signal 138, and a distortion module 140 that produces a distortion component 142. The transfer function of the distortion module may be nonlinear and varies with input signal 144, its history and its slew rate.

Figure 2:
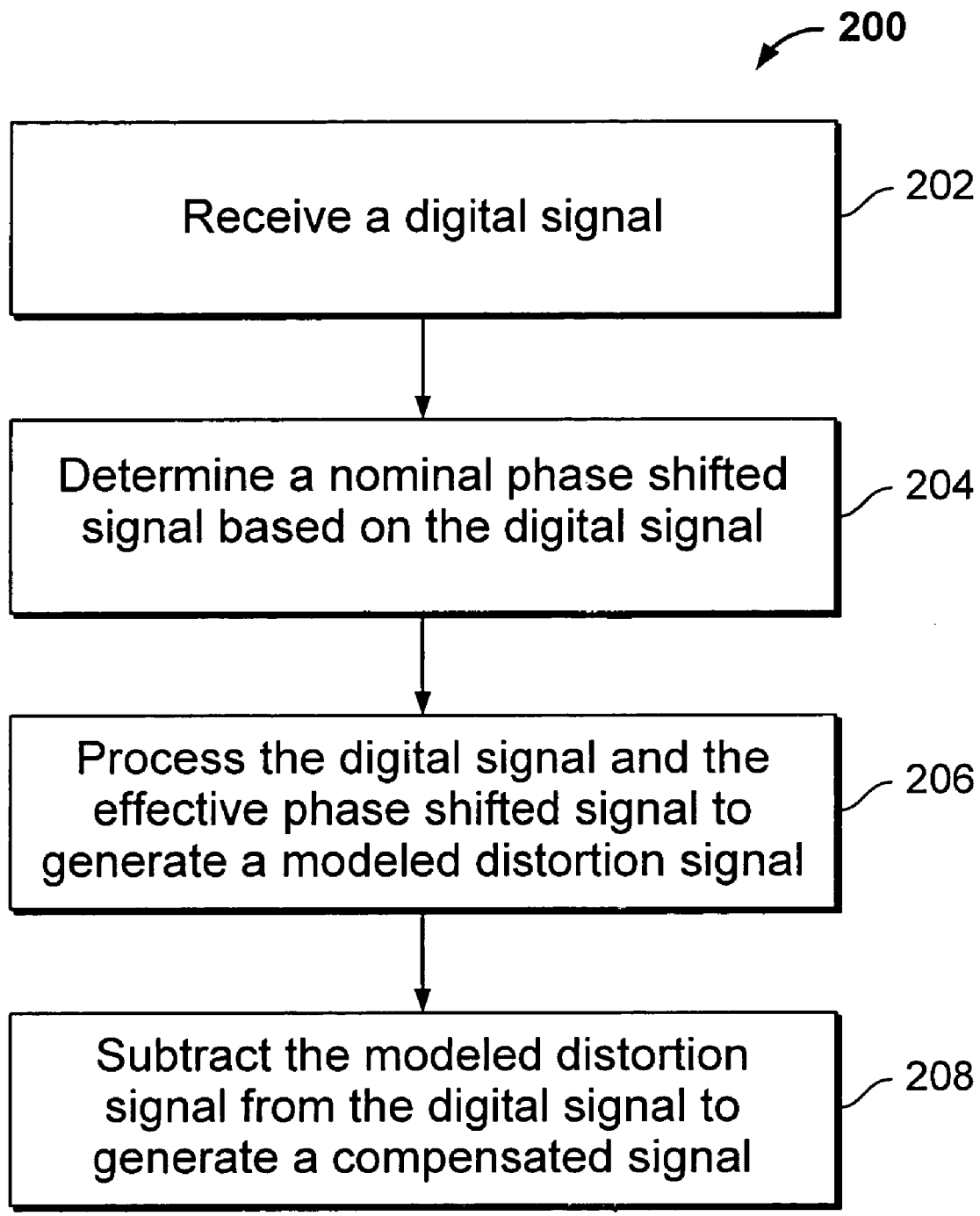
FIG. 2 is a flow chart illustrating an embodiment of a process for compensating for nonlinear distortion in a digital signal.

FIG. 2 is a flow chart illustrating an embodiment of a process for compensating for nonlinear distortion in a digital signal. For purposes of illustration, the following examples discuss in detail the operations and implementations of various linearizer embodiments that compensate for distortion resulting from ADCs. The techniques are also applicable to distortion compensation in transceiver circuits or other appropriate signal processing devices.

In this example, process 200 may be implemented on linearizers 104, 120, 134 or other appropriate devices. The process begins when a digital signal is received (202). The digital signal may be the result of an analog-to-digital converter such as ADC 132 of FIG. 1C. One or more nominal phase shifted signals based on the digital signal are then determined (204). The samples in a nominal phase shifted signal correspond to the samples of the ADC input at fractional sampling phases of the digital signal (in other words, samples at fractional intervals between the sampling periods of the ADC). As will be shown in more details below, the nominal phase shifted signal may be generated using techniques such as interpolation, upsampling, direct modulation, or any other appropriate technique. The received digital signal and the nominal phase shifted signal are processed by a distortion module to generate a modeled distortion signal (206). The modeled distortion signal is then subtracted from the digital signal to generate a compensated signal (208).

Process 200 may be illustrated using the system embodiment shown in FIG. 1C. ADC output 152 corresponds to the received digital signal (202). Nominal phase shifted signals based on the digital signal is determined by system distortion model 146 (204). The digital signal and the nominal phase shifted signals are processed to generate a modeled distortion signal that is approximately equal to distortion signal 142 (206). Estimated distortion 148 is then subtracted from output 152 of ADC 132 to generate a compensated signal 150.

Figure 3A:
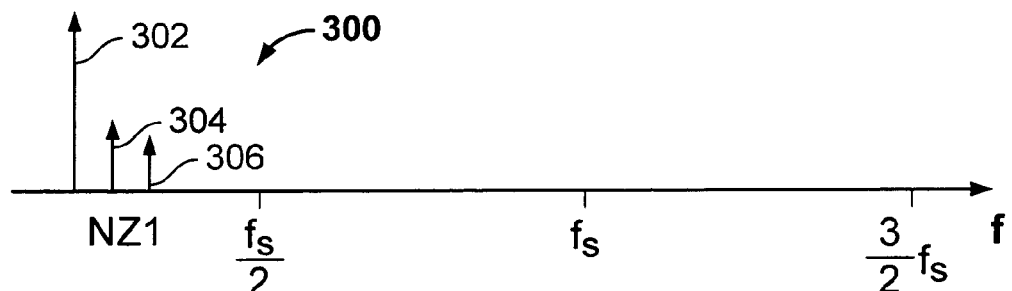
FIGS. 3A–3C are signal diagrams illustrating the processing of a baseband signal according to some linearizer embodiments.
Figure 3B:
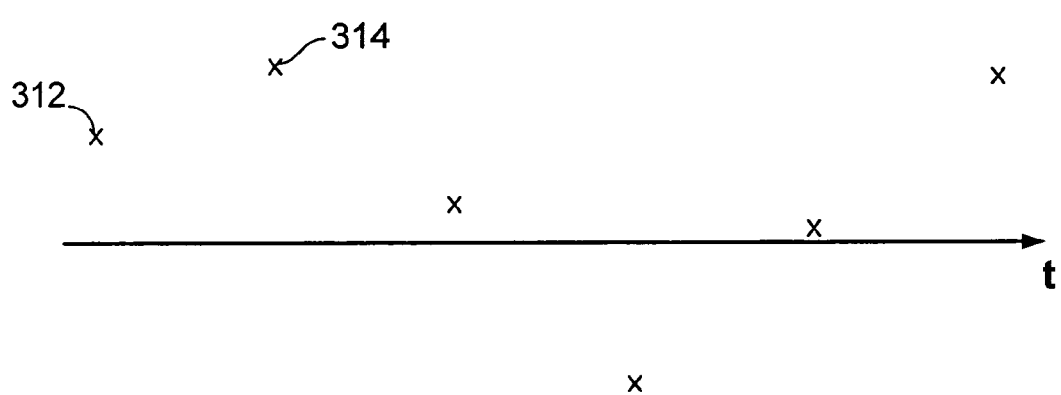
Figure 3C:
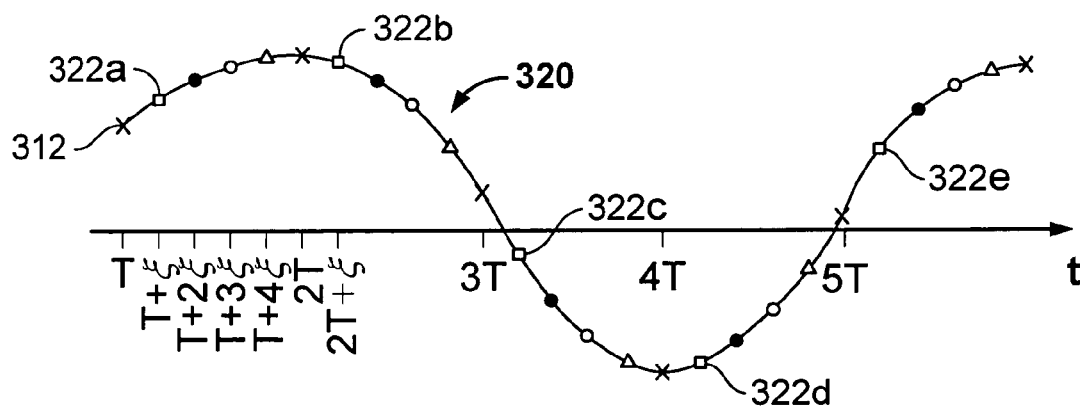

In some embodiments, the linearizer generates nominal phase shifted signals based on the digital signal received. In some embodiments, the linearizer also generates derivatives based on the nominal phase shifted signals. The nominal phase shifted signals and/or the derivatives are used by the system distortion model. FIGS. 3A–3C are signal diagrams illustrating the processing of a baseband signal according to some linearizer embodiments. FIG. 3A is a frequency spectrum diagram illustrating a baseband digital signal 300. In this example, a baseband analog signal is sampled and filtered to produce baseband digital signal 300, therefore the sampling of the baseband analog signal does not have demodulating effects. Signal 300 is shown to include several frequency components. Signal component 302 is the ideal digital signal component without nonlinear distortion. Signals 304 and 306 are the distortion components.

The discrete samples of signal 300 in the time domain are shown in FIG. 3B. The samples can be interpolated to reconstruct a signal that corresponds to the original baseband analog signal. FIG. 3C shows the interpolated signal 320. Nominal phase shifted samples at fractional phases of the ADC's sampling phase are generated according to interpolated signal 320. In the example shown, for an ADC with a sampling period of T, the nominal phase shifted samples are generated at times T+ξ, T+2ξ, . . . , T+nξ, 2T+ξ, 2T+2ξ, . . . , 2T+nξ, etc., where ξ is a fractional value of T. The nominal phase shifted samples and the original samples are sent to the distortion model as inputs. In the example shown, the distortion model depends on the history of the input samples and the derivatives of the input. The nominal phase shifted samples provide enhanced history information, and the derivatives provide information about the signals rate of change. The additional information allows the distortion model to more accurately compute the resulting distortion signal.

In some embodiments, the input frequencies are restricted to a specific region. The distortion model can produce better modeled distortion signal if the frequency region is known. In the examples below, inputs restricted to specific frequency regions referred to as Nyquist zones are discussed in detail. As used herein, the n-th Nyquist zone spans the frequency range between $$\frac{(n-1)}{2}f_s \text{ to } \frac{n}{2}f_s,$$

where $f_s$ is equal to the ADC's sampling frequency. The technique is also applicable to other types of frequency bands.

Figure 4A:
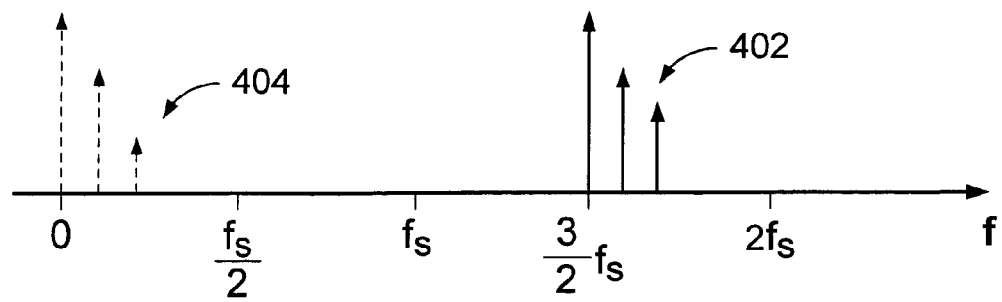
FIGS. 4A–4D are diagrams illustrating the processing of an input signal within a higher order Nyquist zone.

FIGS. 4A–4D are diagrams illustrating the processing of an input signal within a higher order Nyquist zone. FIG. 4A is a frequency spectrum diagram illustrating the input signal.

Figure 4B:
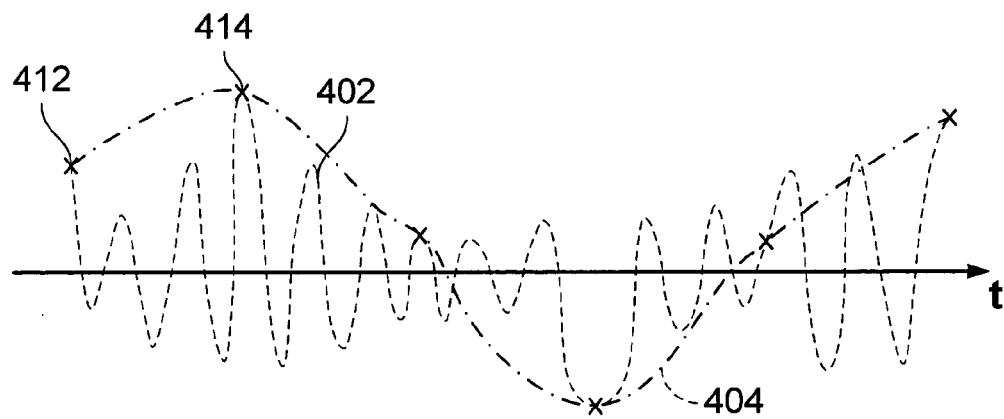

Input 402 is sampled to generate an aliased image 404 in the baseband. FIG. 4B is a time domain diagram illustrating input signal 402 and aliased baseband signal 404. The baseband signal includes samples such as 412 and 414. As shown in this diagram, certain information contained in input signal 402, such as data history and rate of change, is not captured by the baseband samples. Although the original signal 402 is not available to the distortion model in this example, some of the missing information can be recreated by digitally modulating baseband signal 404 to the Nyquist zone where the analog signal originated. In some embodiments, the digital modulation is done directly by multiply the baseband signal with a carrier frequency. In some embodiments, the digital modulation is achieved by upsampling the baseband signal.

Figure 4C:
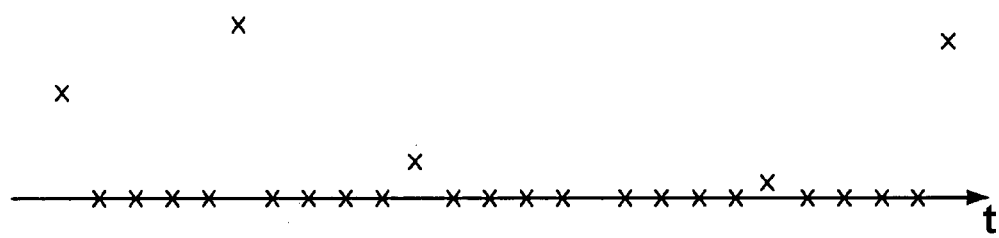
Figure 4D:
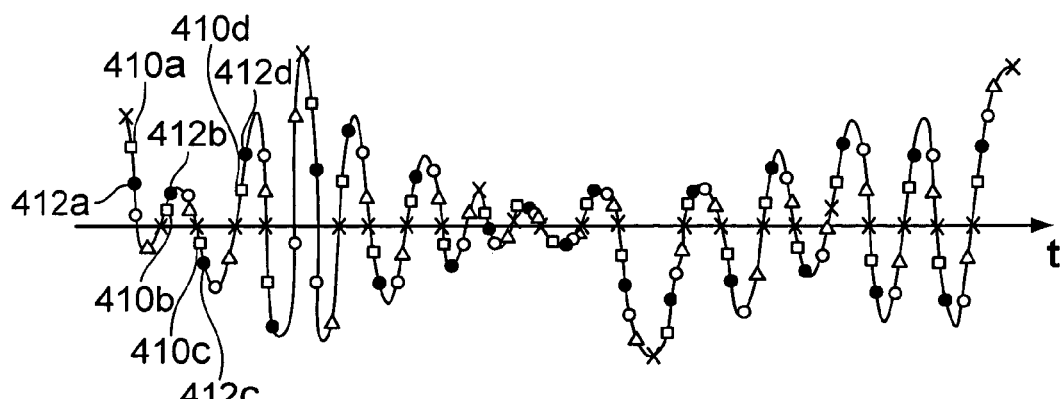

In FIG. 4C, the baseband signal is upsampled. Zeros are inserted where no sample value is available. The upsampling rate R may vary for different embodiments. The choice of R depends on several factors. One of the factors is the ratio of the integral sampling period and the required fractional phase. The upsampling rate should be greater than this ratio. For example, for an integral sampling period of T, if the fractional phase ξ is 0.1 T, then the upsampling rate should be greater than 1/0.1=10. The upsampling rate also depends on the spectrum of the ADC's input signal. In sub-sampling applications, the input signal may be at a higher frequency than the ADC sampling rate. In these applications R is chosen to be equal to the sub-sampling rate times 1/(ξ/T). For example, if the ADC's sampling rate is 100 MHz, and the input signal lies between 150 MHz and 200 MHz, then the sub-sampling rate is 4. This is because 0–50 MHz is the frequency range of the first Nyquist zone, and 150–200 MHz is 4-times higher. If the desired ξ/T=0.1, then the upsampling rate R=4/0.1=40. The upsampled signal is interpolated and band-pass filtered to reconstruct the signal at an appropriate frequency. The nominal phase shifted signals are then obtained at the desired fractional phase as shown in FIG. 4D.

Figure 5:
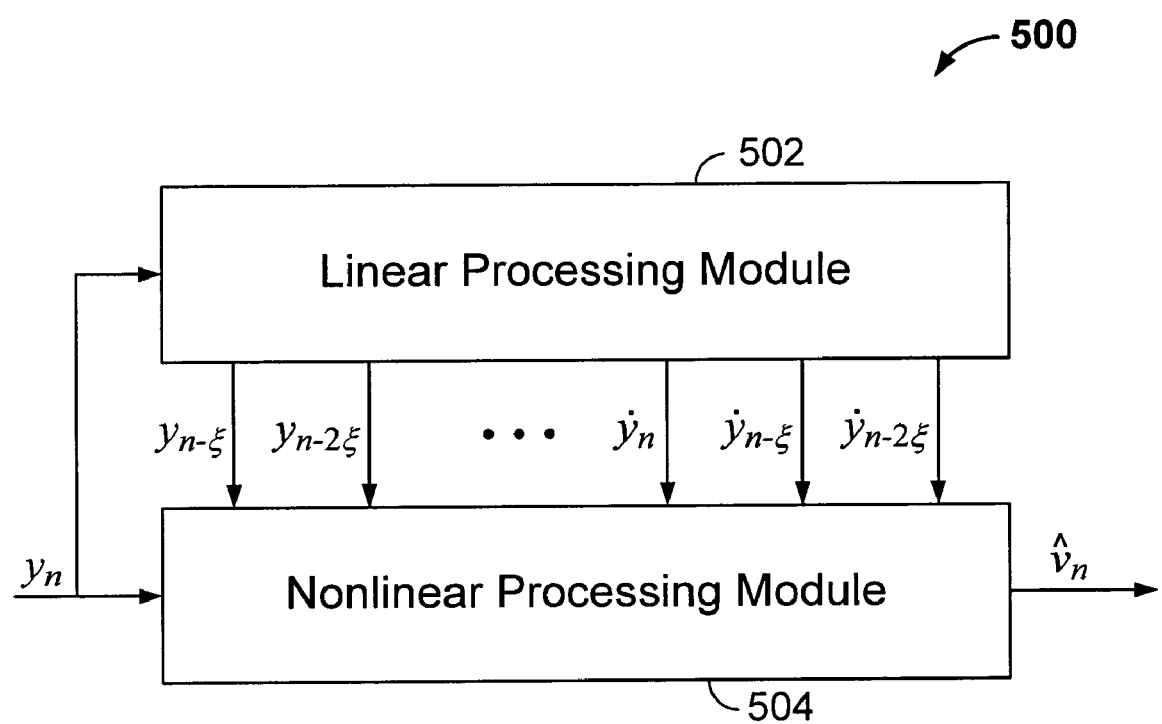
FIG. 5 is a block diagram illustrating a linearizer embodiment.

FIG. 5 is a block diagram illustrating a linearizer embodiment. In this example, linearizer 500 includes a linear processing module 502 coupled with a nonlinear processing module 504. Linear processing module 502 is configured to estimate the nominal phase shifted symbols such as $y_{n-\xi}$ and $y_{n-2\xi}$, and derivates such as $\dot{y}_n$, $\dot{y}_{n-\xi}$ and $\dot{y}_{n-2\xi}$. Nonlinear processing module 504 is configured to implement the distortion model that estimates the distortion based on the digital samples, the nominal phase shifted samples and the derivates.

Figure 6:
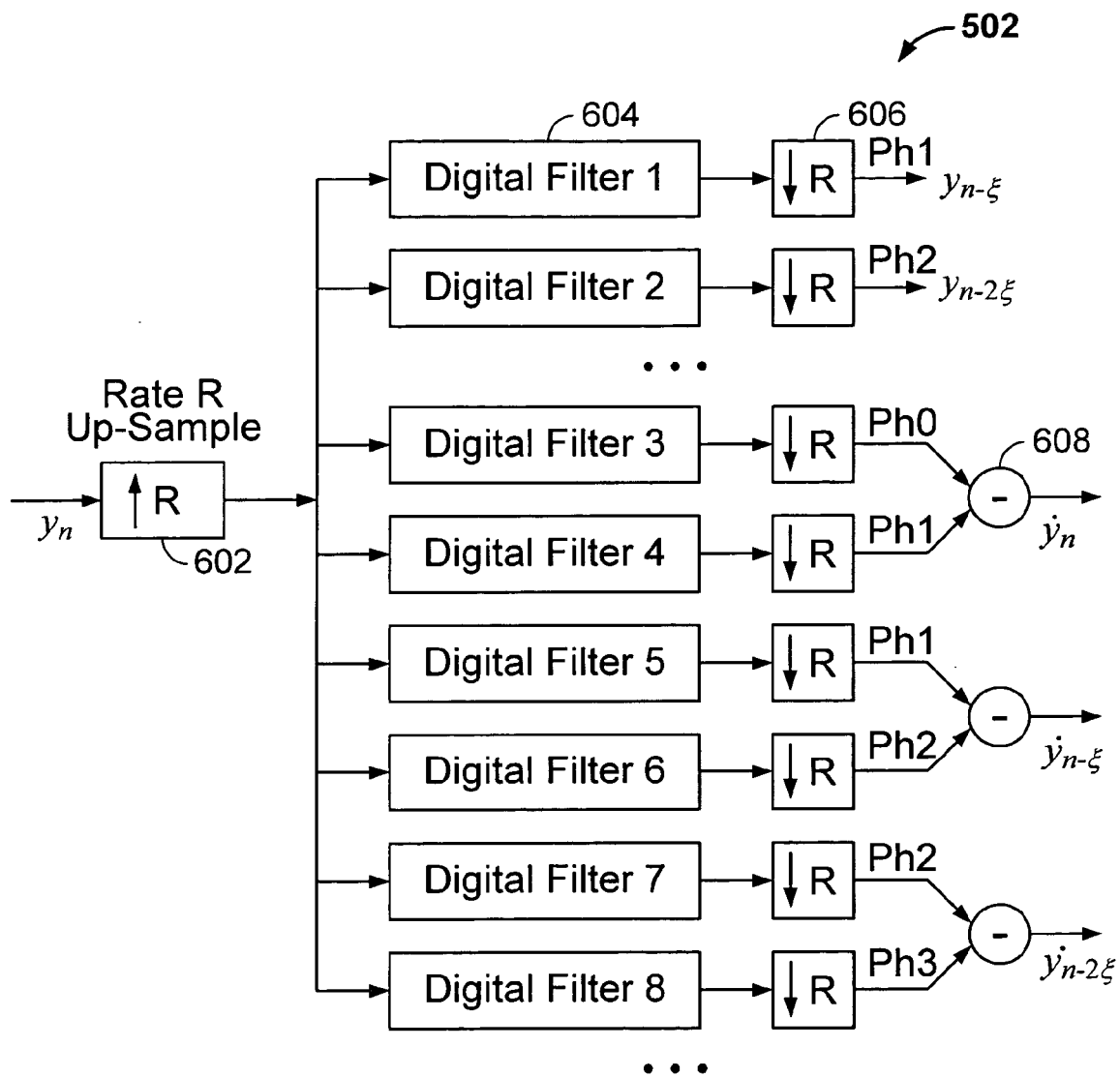
FIG. 6 is a block diagram illustrating the implementation of a linear processing module embodiment.

FIG. 6 is a block diagram illustrating the implementation of a linear processing module embodiment. In this example, linear processing module 502 includes an upsampling module 602 that upsamples digital input $y_n$ at a rate of R. Returning to signal examples shown in FIGS. 4B–4D, input $y_n$ corresponds to the samples shown in FIG. 4B. The output of up-sampling module 602 corresponds to the signal shown in FIG. 4C. Upsampling generates several images of the baseband input signal in different frequency regions. A plurality of digital filters such as digital filter 604 is used to select an image in an appropriate frequency region. In this example, the selected image is located in the same Nyquist zone as the original analog signal that is digitized. Thus, the characteristics of filter bank depend on the desired Nyquist zone. Low-pass, band-pass and high-pass digital filters may be used to achieve the desired filter characteristics.

The outputs of the digital filters are down-sampled by down-samplers such as 606. During the down-sampling operation, each down-sampler selects samples that correspond to a desired phase. FIG. 4D illustrates the results of phase selection according to one embodiment. In the example shown, samples 410a, 410b, 410c, 410d, etc. that correspond to phase 1 are selected to form a nominal phase shifted signal $y_{n-\xi}$. Similarly, samples 412a, 412b, 412c, 412d, etc. that correspond to phase 2 are selected to form a nominal phase shifted signal $y_{n-2\xi}$. The difference between two adjacent phase signals is computed by a differencing module such as 608. Derivatives such as $\dot{y}_n$, $\dot{y}_{n-\xi}$ and $\dot{y}_{n-2\xi}$ are computed based on the difference.

Figure 7:
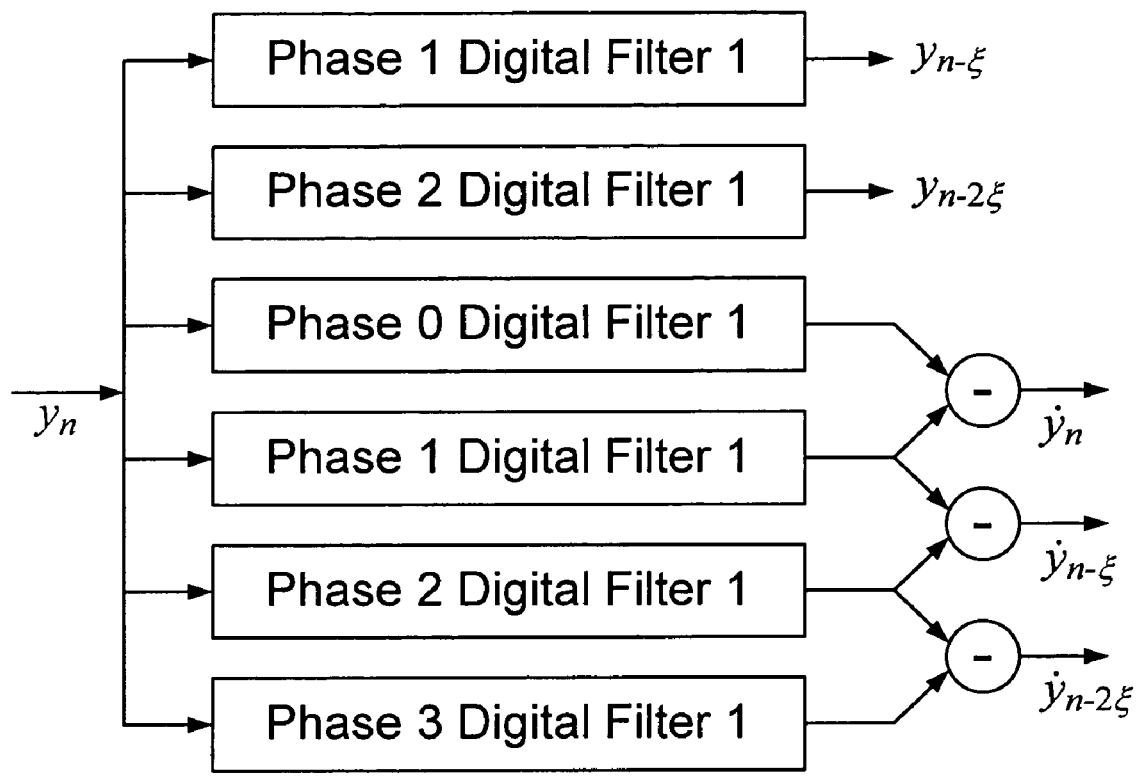
FIG. 7 is a diagram illustrating another linear processing module embodiment.

FIG. 7 is a diagram illustrating another linear processing module embodiment. In this example, the input signal $y_n$ is directly sent to a plurality of digital filters without upsampling. The digital filters used in this example are decimated versions of the digital filters used in FIG. 6. For a given digital filter, the decimation is chosen at an appropriate phase to yield a filter output that corresponds to a nominal phase shifted signal. The differences between filter outputs of adjacent phases provide derivative estimates.

Figure 8:
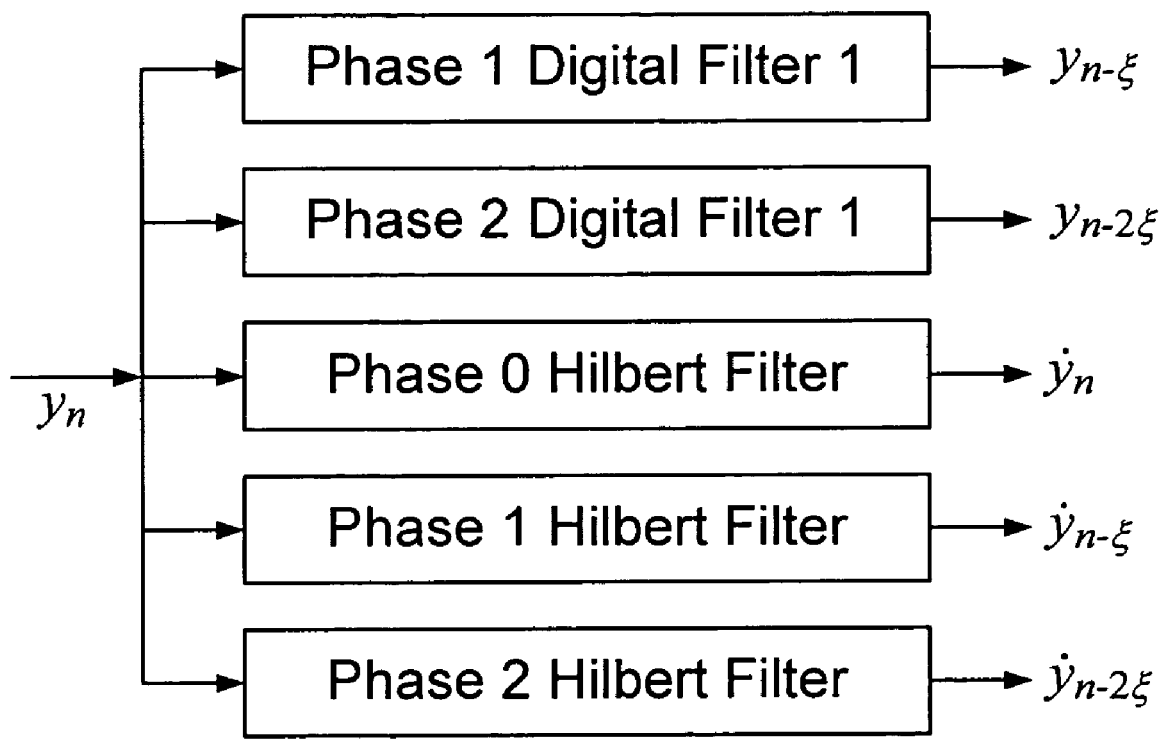
FIG. 8 is a diagram illustrating another linear processing module embodiment.

FIG. 8 is a diagram illustrating another linear processing module embodiment. In this example, two adjacent phase digital filters and their corresponding differencing modules are combined into a digital Hilbert filter. The Hilbert filter has an impulse response that is equivalent to the difference in the impulse responses of digital filters having adjacent phases. The output of the digital Hilbert filter provides a direct estimate of the signal derivative at the desired phase.

Figure 9:
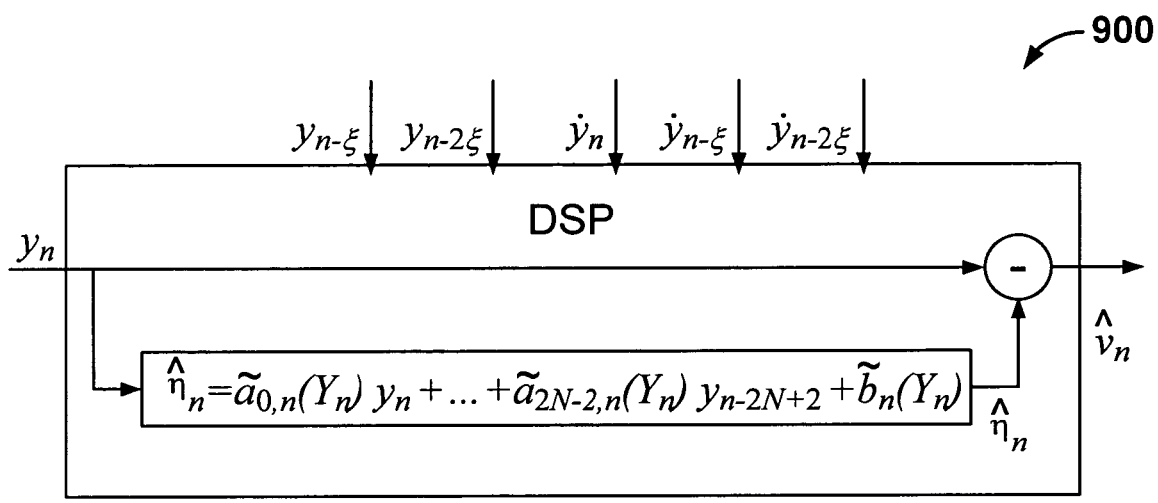
FIG. 9 is a block diagram illustrating a nonlinear processor embodiment.

FIG. 9 is a block diagram illustrating a nonlinear processor embodiment. In this example, nonlinear processor 900 implements the distortion model of the ADC. The transfer function of the distortion model may be derived by sending test inputs with different amplitudes and varying slew rates to the ADC. In some embodiments, the nonlinear transfer function of the distortion model can be expressed as the following general form:

$$\hat{\eta}_n = \tilde{a}_{0,n}(Y_n)y_n + \ldots + \tilde{a}_{2N-2,n}(Y_n)y_{n-2N+2} + \tilde{b}_n(Y_n) \quad \text{(Equation 1)}.$$

where $Y_n$ is a vector including the integral samples, the fractional samples, and the derivatives. An example of $Y_n$ is $$Y_n = [y_n y_{n-\xi} y_{n-2\xi} \dot{y}_n \dot{y}_{n-\xi} \dot{y}_{n-2\xi} y_{n-1} y_{n-2} y_{n-3}].$$

Equation 1 can be viewed as a "linear" convolution between the input variables and the nonlinear coefficients that are time variant nonlinear functions of the input signal. In other words, the function has the form of a linear filter, but with nonlinear coefficients. The relative location of input $Y_n$ in the multi-dimensional input space determines the values of the $\tilde{a}_{j,n}$ and $\tilde{b}_n$ coefficients. The dependence of the filter coefficient values on the input signal vector gives the filter its nonlinear property.

The nonlinear processor output, $\hat{v}_n$, includes a replica of the original linear signal $v_n$ and the residual uncorrected nonlinear distortion $\tilde{\eta}_n$. The relationship may be expressed as:

$$\hat{v}_n = y_n - \hat{\eta}_n = v_n + \eta_n - \hat{\eta}_n = v_n + \tilde{\eta}_n \quad \text{(equation 2), where}$$

$$\tilde{\eta}_n = \eta_n - \hat{\eta}_n \text{hd n(equation 3)}.$$

In some embodiments, a distortion model similar to equation 1 can be implemented using one or more minimum-maximum processors and/or absolute value processors. Details of the implementation are described in U.S. Pat. No. 6,856,191, entitled NONLINEAR FILTER, which is incorporated herein by reference for all purposes. According to the techniques described, the transfer function of the distortion model may be expressed as:

$$\hat{\eta}_n = A^T Y_n + b + \sum_{j=1}^{K} c_j |\vec{\alpha}_j Y_n + \beta_j|. \quad \text{(equation 4)}$$

Let sign $(\vec{\alpha}_j Y_n + \beta_j) = \lambda_{jn}$, equation 4 can be rewritten as:

$$\hat{\eta}_n = \left(a_0 + \sum_{j=1}^{K} c_j \alpha_{0j} \lambda_{jn}\right) y_n + \cdots + \left(a_N + \sum_{j=1}^{K} c_j \alpha_{N,j} \lambda_{jn}\right) y_{n-N} + \left(b + \sum_{j=1}^{K} c_j \beta_j \lambda_{jn}\right). \quad \text{(equation 5)}$$

Equation 5 is also equivalent to equation 1.

The distortion function may be transformed into vector form to simplify the function and achieve computational reductions. In some embodiments, the distortion function is implemented as a low complexity filter with reduced number of multiplication operations. The distortion function of equation 4 can be transformed as follows:

$$\hat{\eta}_n = A^T Y_n + b + \sum_{j=1}^{K_1} c_j |y_n + \beta_j| + \sum_{j=K_1+1}^{K_2} c_j |y_{n-1} + \beta_j| \cdots + \sum_{j=K_{2N-3}+1}^{K_{2N-2}} c_j |y_{n-N} + \beta_j| \quad \text{(equation 6)}$$

$$= A^T Y_n + b + \sum_{j=1}^{K_1} c_j \lambda_{j,n}(y_n + \beta_j) + \sum_{j=K_1+1}^{K_2} c_j \lambda_{j,n}(y_{n-1} + \beta_j) \cdots + \sum_{j=K_{2N-3}+1}^{K_{2N-2}} c_j \lambda_{j,n}(y_{n-N} + \beta_j).$$

Let $\lambda_{j,n}$=sign $(y_{n-1}+\beta_j)$, the function can be further transformed as $$\hat{\eta}_n = \left(a_0 + \sum_{j=1}^{K_1} c_j \lambda_{jn}\right) y_n + \cdots + \left(a_{2n-2} + \sum_{j=K_{2N-3}+1}^{K_{2N-2}} c_j \lambda_{jn}\right) y_{n-N} + \left(b + \sum_{j=1}^{K} c_j \beta_j \lambda_{jn}\right). \quad \text{(equation 7)}$$

A filter implementing the general form of equation 7 is referred to as a first order nonlinear filter since each coefficient is multiplied with terms of y to the first order at most. In some embodiments, $c_j$ and $c_j\beta_j$ are pre-computed and stored. Since $\lambda_{jn}$ is either 1 or −1, the coefficients can be computed without using multiplication and the complexity in filter implementation is greatly reduced.

Other simplifications using vector manipulation are also possible. For example, another simplified form of the distortion function is expressed as:

$$\hat{\eta}_n = f_{0,n}(Y_n)y_n + \ldots + f_{2N-2,n}(Y_n)y_{n-2N+2} + \tilde{a}_{0,n}(Y_n)y_n + \ldots + \tilde{a}_{2N-2,n}(Y_n)y_{n-2N+2} + \tilde{b}_n(Y_n) \quad \text{(equation 8)},$$

where each $f_{k,n}(Y_n)$ is a first order nonlinear function $$f_{k,n}(Y_n) = A_k^T Y_n + b_k + \sum_{j=1}^{K} c_j^k |\vec{\alpha}_j^k Y_n + \beta_j^k| \quad \text{(equation 9)}$$

$$= \tilde{a}_{0,n}^k(Y_n)y_n + \cdots + \tilde{a}_{2N-2,n}^k(Y_n)y_{n-2N+2} + \tilde{b}_n^k(Y_n).$$

Accordingly, each coefficient in equation 8 is a nonlinear function of the input vector elements and some of the coefficients multiply a power-of-two element of the input vector or cross-product-of-two elements of the input vector. A filter implementing this simplified form is referred to as a second order filter.

In some embodiments, the distortion function is simplified to have constants in each discrete input region. This simplification results in a zero order transfer function. The zero order filter is sometimes referred to as a "catastrophic" structure because of the discontinuities in the filter response. A general form of a zero order nonlinear filter is expressed as:

$$\hat{\eta}_n = a_0 + a_1 + \ldots + a_{2N-2} + b + \sum_{j=1}^{K} c_j^0 \lambda_j^0 + \sum_{j=1}^{K} c_j^1 \lambda_j^1 + \ldots + \sum_{j=1}^{K} c_j^{2N-2} \lambda_j^{2N-2}. \quad \text{(equation 10)}$$

To implement a zero order nonlinear filter, combinations of $$\sum_{j=1}^{K} c_j^0 \lambda_{jn}^0, \sum_{j=1}^{K} c_j^1 \lambda_{jn}^1,$$

etc. may be pre-computed, stored and retrieved based on the appropriate input. In some embodiments, the coefficient value is determined using an indicator that indicates the relative location of the input within the range of possible inputs. The indicator is sometimes referred to as a "thermometer code," which is a vector having a total of at most one sign change among any two adjacent elements.

Take the following second order function as an example:

$$\hat{\eta}_n = a_0 y_n + a_1 y_{n-1} + b + \sum_{j=1}^{K} c_j^0 |y_n + \beta_j^0| y_n + \sum_{j=1}^{K} c_j^1 |y_{n-1} + \beta_j^1| y_n \quad \text{(equation 11)}$$

$$= \left(\sum_{j=1}^{K} c_j^0 \lambda_j^0\right) y_n^2 + \left(\sum_{j=1}^{K} c_j^1 \lambda_j^1\right) y_n y_{n-1} + \left(a_0 + \sum_{j=1}^{K} c_j^0 \lambda_j^0 \beta_j^0 + \sum_{j=1}^{K} c_j^1 \lambda_j^1 \beta_j^1\right) y_n + a_1 y_{n-1} + b$$

$$= \tilde{a}_{01,n} y_n^2 + \tilde{a}_{1,n} y_n y_{n-1} + \tilde{a}_{0,n} y_n + a_{1,n} y_{n-1} + b.$$

The input is compared to the set of $\beta_j^K$ values to determine the relative location of the input variable within the range of possible inputs, and the vector of $\lambda_{j,n}$, denoted as $\Lambda_n$. Depending on the input, $\Lambda_n$ may be a vector with terms that are +1 only, −1 only, or −1 for the first k terms and +1 for the rest of the terms. In other words, $\Lambda_n$ is a thermometer code with at most one sign change among its terms. For example, assuming that constants $\beta_j^K$ are distributed across the dynamic range of $y_n \in (-1,1)$ and there are 8 values of $$\beta_j^k \in \left(-\frac{4}{7} - \frac{3}{7} - \frac{2}{7} - \frac{1}{7} \frac{1}{7} \frac{2}{7} \frac{3}{7} \frac{4}{7}\right). \text{ If } y_n < -\frac{4}{7}, \text{ then}$$

$$\Lambda_n = [-1 -1 -1 -1 -1 -1 -1 -1]. \text{ If } y_n > \frac{4}{7}, \text{ then}$$

$$\Lambda_n = [+1 +1 +1 +1 +1 +1 +1 +1].$$

If $y_n$ is somewhere in between, $\Lambda_n$ may have a sign change. For example, if $$y_n = \frac{3.5}{7}, \text{ then } \Lambda_n = [-1 -1 -1 -1 -1 -1 -1 +1].$$

$$\text{If } y_n = \frac{1.5}{7}, \Lambda_n = [-1 -1 -1 +1 +1 +1 +1 +1].$$

then Since the thermometer code has only 8 valves, there are only 8 possible values for $$\tilde{a}_{01,n} = \sum_{j=1}^{K} c_j^0 \lambda_j^0,$$

8 possible values for $$\hat{a}_{1,n} = \sum_{j=1}^{K} c_j^1 \lambda_{j,n}^1,$$

and 64 possible values for $$\tilde{a}_{0,n} = a_0 + \sum_{j=1}^{K} c_j^0 \lambda_j^0 \beta_j^0 + \sum_{j=1}^{K} c_j^1 \lambda_j^1 \beta_j^1.$$

The number of add operations can be reduced by pre-computing the possible values for coefficients of $\tilde{a}_{01,n}$, $\hat{a}_{1,n}$, etc. and storing them in memory. In this example, the addresses of the coefficients are stored in a lookup table, which stores the 8 possibilities of thermometer code $\Lambda_n$ and the corresponding addresses of pre-computed coefficients. The coefficients can be retrieved by accessing the memory addresses that correspond to the appropriate thermometer code entry. Once the coefficients $\tilde{a}_{01,n}$, $\hat{a}_{11,n}$ etc. . . . are read out of memory, the filter output can be computed as $$\hat{\eta}_n = \tilde{a}_{01,n} y_n^2 + \hat{a}_{1,n} y_n y_{n-1} + \tilde{a}_{0,n} y_n + a_{1,n} y_{n-1} + b \quad \text{(equation 12)}.$$

This technique is also applicable to zero, first or higher order filters.

Low complexity nonlinear filters may be implemented based on the simplified forms. In some embodiments, the low complexity linear filter includes a processor coupled to the nonlinear filter, configured to determine the relative location of the input variable within a range of possible inputs and to determine a filter coefficient of the nonlinear filter using the relative location of the input variable. The filter coefficients can be determined without using multiplication operations. In some embodiments, filter coefficients for zero order, first order, second order and/or higher order filters are pre-computed, stored and retrieved when appropriate. Higher order filters can be formed by nesting lower order filters. Details of implementing a nonlinear transfer function using low-complexity filter or thermometer code are described in U.S. patent application Ser. No. 11/061,850 entitled LOW-COMPLEXITY NONLINEAR FILTERS, filed Feb. 18, 2005, which is incorporated herein by reference for all purposes.

In some embodiments, the distortion model is temperature compensated. The coefficients of the distortion model at different temperatures are predetermined and stored. During operation, the coefficients corresponding to the operating temperature is selected to construct an appropriate distortion correction filter. In some embodiments, the operating temperature is used to analytically determine the corresponding coefficients. In other words, the coefficients are computed based on a function of the input and its history, the derivatives of the input, the temperature, the changes in temperature, any other appropriate factors or a combination thereof.

An improved method for compensating nonlinear distortions in digital signals and a linearizer system have been disclosed. Nonlinearities of ADCs, receivers, or other systems with nonlinear channel characteristics can be more effectively compensated by modeling the nonlinearities using the digital signal, the nominal phase shifted signals, and their derivatives.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of compensating for nonlinear distortions in a digital signal, comprising:
   receiving the digital signal;
   generating a nominal phase shifted signal based on the digital signal;
   generating a modeled distortion signal based on the digital signal and the nominal phase shifted signal;
   subtracting the modeled distortion signal from the digital signal; and
   generating a compensated signal;
   wherein the digital signal includes an undistorted digital component and a distortion component.

2. A method as recited in claim 1, wherein the digital signal results from an analog input signal restricted to a known region of operation.

3. A method, of compensating for nonlinear distortions in a digital signal, comprising:
   receiving the digital signal;
   generating a nominal phase shifted signal based of the digital signal;
   generating a modeled distortion signal based on the digital signal and the nominal phase shifted signal;
   subtracting th modeled distortion signal from the digital signal; and generating a compensated signal;
wherein the digital signal results form an analog input signal restricted to a specific Nyquist zone.

4. A method as recited in claim 1, further comprising generating a modeled distortion signal that is a function of both the undistorted digital component and the distorted component.

5. A method as recited in claim 1, wherein generating the nominal phase shifted signal includes modulating the digital signal.

6. A method as recited in claim 1, wherein generating the nominal phase shifted signal includes interpolating the digital signal and taking interpolated values at fractional intervals of a sampling period of the digital signal.

7. A method as recited in claim 1, wherein generating the nominal phase shifted signal includes up-sampling the digital signal to generate an up-sampled signal, filtering the up-sampled signal and obtaining interpolated values at fractional intervals of a sampling period of the digital signal.

8. A method as recited in claim 1, wherein:
the digital signal results from an analog input signal restricted to a known region of operation; and
generating the nominal phase shifted signal includes:
up-sampling the digital signal to generate an up-sampled signal;
filtering the up-sampled signal according to the known region of operation; and
obtaining interpolated values at fractional intervals of a sampling period of the digital signal.

9. A method as recited in claim 1, further comprising generating a derivative of the digital signal; wherein the modeled distortion signal is generated based on the digital signal, the nominal phase shifted signal and the derivative of the digital signal.

10. A method as recited in claim 1, further comprising generating a nominal phase shifted derivative of the digital signal; wherein the modeled distortion signal is generated based on the digital signal, the nominal phase shifted signal and the nominal phase shifted derivative to the distortion model.

11. A method of compensating for nonlinear distortions in a digital signal, comprising:
receiving the digital signal;
generating a nominal phase shifted signal based on the digital signal;
generating a modeled distortion signal based on the digital and the nominal phase shifted signal;
subtracting the modeled distortion signal from the digital signal; and
generating a compensated signal;
wherein the digital signal is generated by an analog-to-digital converter.

12. A method of compensating for nonlinear distortions in a digital signal, comprising:
receiving the digital signal;
generating a nominal phase shifted signal based on the digital signal;
generating a modeled distortion signal based on the digital and the nominal phase shifted signal;
subtracting the modeled distortion signal from the digital signal; and
generating a compensated signal;
wherein the digital signal is generated by a radio frequency receiver.

13. A compensating system comprising:
an input interface configured to receive a digital signal having nonlinear distortion; and
a distortion model coupled to the interface, configured to:
generate a nominal phase shifted signal based on the digital signal;
generate a modeled distortion signal based on the digital signal and the nominal phase shifted signal;
subtract the modeled distortion signal from the digital signal; and
generate a compensated signal;
wherein the digital signal includes an undistorted digital component and a distortion component.

14. A compensating system as recited in claim 13, wherein the digital signal results from an analog input signal restricted to a known region of operation.

15. A compensating system comprising:
an input interface configured to receive a digital signal having nonlinear distortion; and
a distortion model coupled to the interface, configured to:
generate a nominal phase shifted signal based on the digital signal;
generate a modeled distortion signal based on the digital signal and the nominal phase shifted signal;
subtract the modeled distortion signal from the digital signal; and
generate a compensated signal;
wherein the digital signal results from an analog input signal restricted to a specific Nyquist zone.

16. A compensating system as recited in claim 13, wherein the digital signal includes an undistorted digital component and a distortion component, and the distortion model is further configured to generate a modeled distortion signal that is a function of both the undistorted digital component and the distorted component.

17. A compensating system as recited in claim 13, wherein generating the nominal phase shifted signal includes modulating the digital signal.

18. A compensating system as recited in claim 13, wherein generating the nominal phase shifted signal includes interpolating the digital signal and taking interpolated values at fractional intervals of a sampling period of the digital signal.

19. A compensating system as recited in claim 13, wherein generating the nominal phase shifted signal includes up-sampling the digital signal to generate an up-sampled signal, filtering the up-sampled signal and obtaining interpolated values at fractional intervals of a sampling period of the digital signal.

20. A compensating system as recited in claim 13, wherein:
the digital signal results from an analog input signal restricted to a known region of operation; and
generating the nominal phase shifted signal includes:
up-sampling the digital signal to generate an up-sampled signal;
filtering the up-sampled signal according to the known region of operation; and
obtaining interpolated values at fractional intervals of a sampling period of the digital signal.

21. A compensating system as recited in claim 13, further comprising generating a derivative of the digital signal and inputting the derivative of the digital signal to the distortion model.

22. A compensating system as recited in claim 13, further comprising generating a nominal phase shifted derivative of the digital signal and inputting the nominal phase shifted derivative to the distortion model.

23. A compensating system comprising:
an input interface configured to receive a digital signal having nonlinear distortion; and
a distortion model coupled to the interface, configured to:
  generate a nominal phase shifted based on the digital signal;
  generate a modeled distortion signal based on the digital signal and the nominal phase shifted signal;
  subtract the modeled distortion signal from the digital signal; and
  generate a compensated signal;
wherein the digital signal is generated be an analog-to-digital converter.

24. A compensating system comprising:
an input interface configured to receive a digital signal having nonlinear distortion; and
a distortion model coupled to the interface, configured to:
  generate a nominal phase shifted based on the digital signal;
  generate a modeled distortion signal based on the digital signal and the nominal phase shifted signal;
  subtract the modeled distortion signal from the digital signal; and
  generate a compensated signal;
wherein the digital signal is generated by a radio frequency receiver.

25. A compensating system comprising:
an input interface configured to receive a digital signal having nonlinear distortion; and
a distortion model coupled to the interface, configured to:
  generate a nominal phase shifted based on the digital signal;
  generate a modeled distortion signal based on the digital signal and the nominal phase shifted signal;
  subtract the modeled distortion signal from the digital signal; and
  generate a compensated signal;
wherein the digital signal is generated by a nonlinear system having nonlinear channel characteristics.

26. A compensating system comprising:
an input interface configured to receive a digital signal having nonlinear distortion; and
a distortion model coupled to the interface, configured to:
  generate a nominal phase shifted based on the digital signal;
  generate a modeled distortion signal based on the digital signal and the nominal phase shifted signal;
  subtract the modeled distortion signal from the digital signal; and
  generate a compensated signal;
wherein the distortion model comprises a linear processing module coupled with a nonlinear processing module.

27. A compensating system as recited in claim 26, wherein the linear processing module is configured to generate the nominal phase shifted signal and the nonlinear processing module is configured to implement a nonlinear distortion function.

28. A compensating system as recited in claim 13, wherein the distortion model includes a low complexity filter configured to implement a nonlinear distortion function.

29. A compensating system as recited in claim 13, wherein the distortion modeled implements a nonlinear function that has a linear form with nonlinear coefficients.

30. A compensating system as recited in claim 13, wherein the distortion modeled implements a nonlinear function having a plurality of coefficients, and the plurality of coefficients are determined using a thermometer code.

31. A compensating system as recited in claim 13, wherein the distortion model is temperature compensated.

32. A computer program product for compensating for nonlinear distortion in a digital signal, the computer program product being embodied in a computer readable medium and comprising computer instructions for:
  receiving the digital signal;
  generating a nominal phase shifted signal based on the digital signal;
  generating a modeled distortion signal based on the digital signal and the nominal phase shifted signal;
  subtracting the modeled distortion signal from the digital signal; and
  generating a compensated signal;
wherein the digital signal includes an undistorted digital component and a distortion component.

* * * * *